(12) United States Patent
Chainer et al.

(10) Patent No.: US 10,548,241 B2
(45) Date of Patent: Jan. 28, 2020

(54) TWO-PHASE COOLING WITH AMBIENT COOLED CONDENSOR

(71) Applicant: INTERNATIONAL BUSINESS MACHINES CORPORATION, Armonk, NY (US)

(72) Inventors: Timothy J. Chainer, Yorktown Heights, NY (US); Milnes P. David, Poughkeepsie, NY (US); Pritish R. Parida, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 558 days.

(21) Appl. No.: 14/750,946

(22) Filed: Jun. 25, 2015

(65) Prior Publication Data

US 2016/0274628 A1 Sep. 22, 2016

Related U.S. Application Data

(63) Continuation of application No. 14/664,148, filed on Mar. 20, 2015, now Pat. No. 10,231,357.

(51) Int. Cl.
*H05K 7/20* (2006.01)
*G06F 1/20* (2006.01)
(Continued)

(52) U.S. Cl.
CPC ......... *H05K 7/20354* (2013.01); *G06F 1/206* (2013.01); *H05K 7/2029* (2013.01);
(Continued)

(58) Field of Classification Search
CPC ............. H05K 7/2029; H05K 7/20309; H05K 7/20318; H05K 7/20327; H05K 7/20381;
(Continued)

(56) References Cited

U.S. PATENT DOCUMENTS

| 4,164,852 A * | 8/1979 | Anzalone ................ F24F 13/00 310/112 |
| 5,293,754 A | 3/1994 | Mizuno |

(Continued)

FOREIGN PATENT DOCUMENTS

WO  WO2013034170 A1  3/2013

OTHER PUBLICATIONS

U.S. Office Action dated Aug. 25, 2017 for U.S. Appl. No. 14/664,168.

*Primary Examiner* — Edward F Landrum
*Assistant Examiner* — Daniel C Comings
(74) *Attorney, Agent, or Firm* — F. Chau & Associates, LLC

(57) ABSTRACT

An apparatus for cooling a computer system includes a primary cooling loop. The primary cooling loop includes an evaporator configured to cool at least a component of the computer system, an ambient cooled condenser connected to the evaporator, a first pump to provide a coolant flow within the cooling loop, a pressure regulator configured to maintain a selected pressure in the primary cooling loop, and a controller responsive to changes in outdoor ambient conditions and an amount of heat dissipated by the computer system and configured to dynamically adjust the pump and pressure regulator in response thereto.

10 Claims, 6 Drawing Sheets

(51) Int. Cl.
 *F25B 39/04* (2006.01)
 *H01L 23/34* (2006.01)
 *H01L 23/427* (2006.01)

(52) U.S. Cl.
 CPC ..... *H05K 7/20309* (2013.01); *H05K 7/20318* (2013.01); *H05K 7/20809* (2013.01); *F25B 39/04* (2013.01); *F25B 2339/04* (2013.01); *F25B 2339/044* (2013.01); *F25B 2600/13* (2013.01); *F25B 2600/2513* (2013.01); *F25B 2600/2515* (2013.01); *F25B 2700/2106* (2013.01); *F25B 2700/21172* (2013.01); *F25B 2700/21175* (2013.01); *G06F 2200/201* (2013.01); *H01L 23/34* (2013.01); *H01L 23/427* (2013.01); *H05K 7/20327* (2013.01); *Y02D 10/16* (2018.01)

(58) Field of Classification Search
 CPC .... F25B 2700/2016; F25B 2700/21172; F25B 2700/21175; F25B 2600/13; F25B 2600/25; F25B 2600/2513; F25B 2600/2515
 USPC ........................................................ 62/259.2
 See application file for complete search history.

(56) References Cited

U.S. PATENT DOCUMENTS

| | | | |
|---|---|---|---|
| 5,508,884 A * | 4/1996 | Brunet | F28D 15/06 165/104.33 |
| 5,720,338 A | 2/1998 | Larson et al. | |
| 6,138,469 A * | 10/2000 | Davidson | F25B 17/08 257/E23.088 |
| 7,061,763 B2 | 6/2006 | Tsoi | |
| 7,210,303 B2 * | 5/2007 | Zhang | F25B 9/008 62/183 |
| 7,855,890 B2 * | 12/2010 | Kashirajima | F25B 25/00 361/679.46 |
| 7,908,881 B2 | 3/2011 | Kopko | |
| 8,120,916 B2 | 2/2012 | Schmidt et al. | |
| 8,322,154 B2 | 12/2012 | Campbell et al. | |
| 8,369,090 B2 | 2/2013 | Chester et al. | |
| 8,499,574 B2 * | 8/2013 | Suzuki | F25B 49/022 62/228.1 |
| 8,505,324 B2 | 8/2013 | Goodfellow | |
| 9,726,420 B2 * | 8/2017 | Ishikawa | F25B 47/02 |
| 2009/0071630 A1 | 3/2009 | Weber | |
| 2012/0325436 A1 | 12/2012 | Shedd | |
| 2013/0027884 A1 * | 1/2013 | Campbell | H05K 7/2029 361/700 |
| 2014/0138044 A1 * | 5/2014 | Kawakami | B60H 1/00278 165/11.1 |

* cited by examiner

TWO-PHASE COOLING WITH AMBIENT COOLED CONDENSOR

CROSS REFERENCE TO RELATED UNITED STATES APPLICATIONS

This case is a continuation of, and claims priority from, U.S. patent application Ser. No. 14/664,148 of Chainer, et al., filed on Mar. 20, 2015 in the U.S. Patent and Trademark Office, the contents of which are herein incorporated by reference in their entirety.

BACKGROUND

Technical Field

Embodiments of the present disclosure are directed to cooling systems for semi-conductor electronic devices such as computer processors.

Discussion of the Related Art

The application of two phase cooling for embedded cooling of microprocessors may improve computational efficiency by reducing the total power usage of a computer system. Current cooling methods are not suitable for microprocessors with a high heat flux or for cooling 3-dimensional (3D) chip stacks.

SUMMARY

According to an embodiment of the disclosure, there is provided an apparatus for cooling a computer system that includes a primary cooling loop. The primary cooling loop includes an evaporator configured to cool at least a component of the computer system, an ambient cooled condenser connected to the evaporator, a first pump to provide a coolant flow within the cooling loop, a pressure regulator configured to maintain a selected pressure in the primary cooling loop, and a controller responsive to changes in outdoor ambient conditions and an amount of heat dissipated by the computer system and configured to dynamically adjust the pump and pressure regulator in response thereto.

According to a further embodiment of the disclosure, the apparatus for cooling a computer system includes a pressure monitor configured to monitor the flow rate of the coolant in the liquid coolant loop, wherein the first pump is connected to the computer system component and condenser.

According to a further embodiment of the disclosure, the apparatus for cooling a computer system includes a temperature monitor configured to monitor the outdoor ambient temperature and the coolant in the liquid coolant loop.

According to a further embodiment of the disclosure, outdoor ambient conditions include outdoor ambient temperature, and pressure of the liquid coolant is regulated based on a temperature delta above the outdoor ambient temperature.

According to a further embodiment of the disclosure, the evaporator cools high heat density components of the computer system by evaporation of the liquid coolant into a vaporized coolant.

According to a further embodiment of the disclosure, the apparatus for cooling a computer system includes a secondary cooling loop. The ambient cooled condenser transfers heat released by condensation of the vaporized coolant to a secondary coolant in a secondary coolant loop, and secondary coolant loop includes a cooler that exchanges heat with an ambient external environment and a second pump to generate a coolant flow between the ambient cooled condenser and the condenser.

According to a further embodiment of the disclosure, the controller controls one or both of the first pump and the second pump.

According to a further embodiment of the disclosure, the cooler is one of a wet cooler and a dry cooler.

According to a further embodiment of the disclosure, the apparatus for cooling a computer system includes a third coolant loop connected to the second coolant loop, said third coolant loop including an auxiliary system that uses heat being transferred by the secondary coolant loop.

According to a further embodiment of the disclosure, the auxiliary system is one of a heat recovery system, a geothermal system, or a building chiller.

According to a further embodiment of the disclosure, low heat density components of the computer system are used to preheat the liquid coolant.

According to a further embodiment of the disclosure, the secondary coolant loop further includes a liquid to liquid heat exchanger unit that divides the secondary coolant loop into an indoor coolant loop and an outdoor coolant loop, wherein the indoor coolant loop uses a coolant with a higher freezing point than a coolant in the outdoor loop.

According to an embodiment of the disclosure, there is provided a method of cooling a computer system, including determining an outside ambient temperature, determining an expected amount of heat to be dissipated from said computer system, setting a pressure of a liquid coolant that minimizes an amount of energy needed to condense a vaporized coolant into a liquid coolant, wherein said pressure is set based on a temperature-delta above the outside ambient temperature and the expected amount of heat, evaporating the liquid coolant from high heat density components of the computer system wherein a vaporized coolant is formed, and condensing the vaporized coolant into a liquid coolant.

According to a further embodiment of the disclosure, the method includes monitoring the outdoor ambient temperature and changing the liquid coolant flow rate in response to changes in the outdoor ambient temperature.

According to a further embodiment of the disclosure, the method includes monitoring the liquid coolant pressure and changing the liquid coolant flow rate in response to changes thereto.

According to a further embodiment of the disclosure, the method includes comprising measuring an amount of heat dissipated by the computer system, and changing the liquid coolant flow rate in response to changes thereto.

According to a further embodiment of the disclosure, the method includes preheating the liquid coolant using low heat density components of the computer system.

According to a further embodiment of the disclosure, the method includes transferring heat released by condensation of the vaporized coolant to one of an ambient, a geothermal, or an energy re-use apparatus.

According to a further embodiment of the disclosure, the method includes adjusting a flow rate of the liquid coolant to minimize the temperature delta, for higher outdoor temperatures.

According to a further embodiment of the disclosure, the method includes minimizing a flow rate of the liquid coolant while maintaining a temperature of the liquid coolant temperature within preset limits, for lower outdoor temperatures.

DETAILED DESCRIPTION

Figures 1A, 1B:
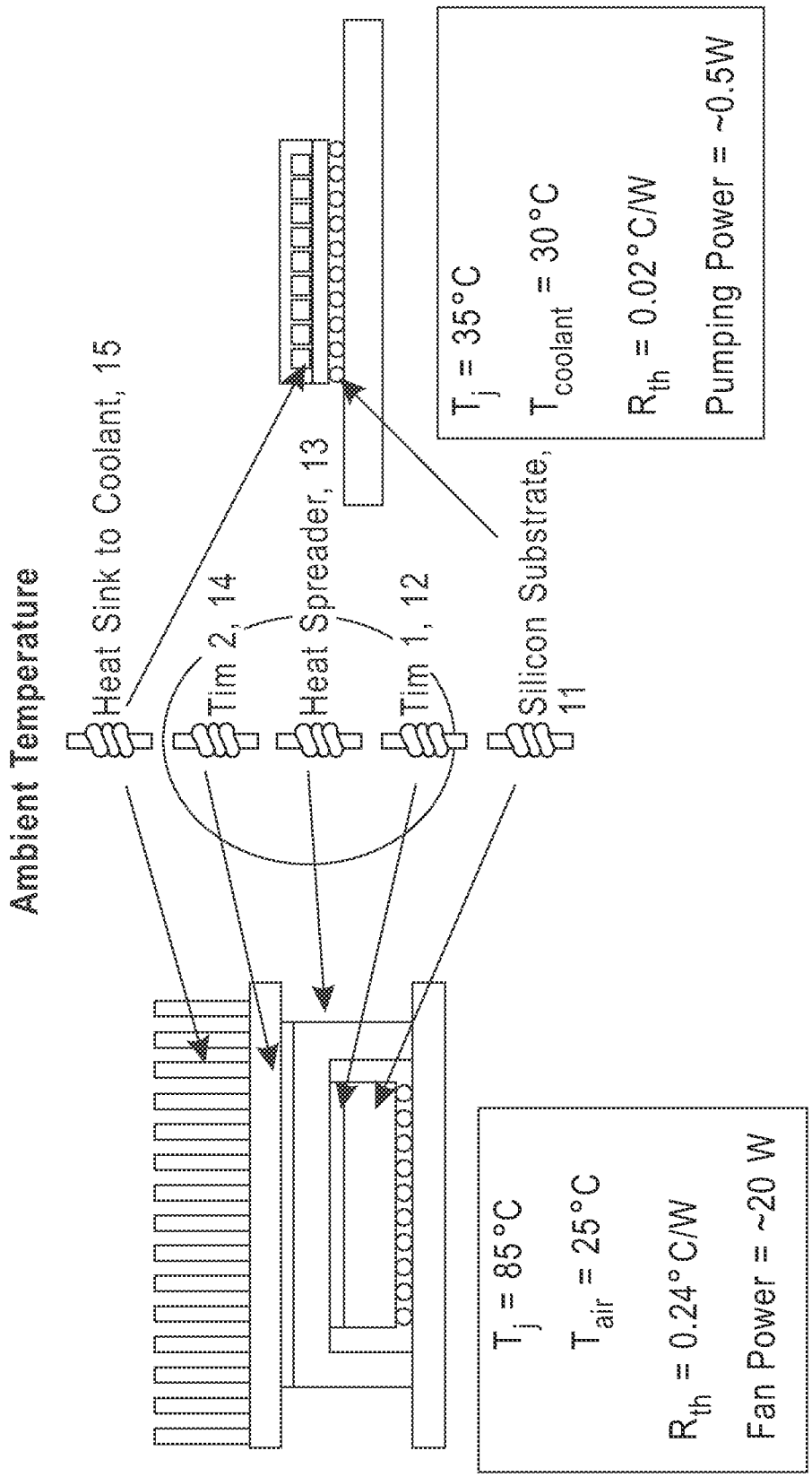
FIGS. 1(a)-(b) illustrates the thermal resistance of chip package stacks, according to embodiments of the disclosure.

Exemplary embodiments of the disclosure as described herein generally include two phase cooling systems for microprocessors. Accordingly, while embodiments of the disclosure are susceptible to various modifications and alternative forms, specific embodiments thereof are shown by way of example in the drawings and will herein be described in detail. It should be understood, however, that there is no intent to limit embodiments of the disclosure to the particular exemplary embodiments disclosed, but on the contrary, embodiments of the disclosure cover all modifications, equivalents, and alternatives falling within the spirit and scope of the disclosure.

Embodiments of the present disclosure can realize thermal improvements over the baseline air cooled systems by deploying an intrachip two-phase evaporative cooling to minimize thermal resistance and achieve a lower temperature gradient between the chip junction and the local refrigerant temperature. An exemplary, non-limiting low global-warming potential refrigerant is R1234ze. Moreover, effective use of latent heat in flow boiling mitigates the issue of a junction temperature rise across the chip when compared against a single-phase water cooling solution. An intrachip cooling system according to an embodiment of the disclosure can also address heat flux, heat density, total heat and hot spot mitigation.

FIGS. 1(a)-(b) illustrates the thermal resistance of a chip package stack, in which a typical air cooled chip package, shown in FIG. 1(a), is compared to an intrachip embedded cooling technology system according to an embodiment of the disclosure, shown in FIG. 1(b). In a typical commercial system, the heat generated by a CMOS processor core is conducted through a silicon substrate 11 and a first thermal interface material (TIM1) 12 that provides thermal contact between the die and a heat-spreader/lid 13 typically made of copper. A typical, non-limiting die thickness is 780 μm. The heat spreader is attached through a second thermal interface material (TIM2) 14 to an air cooled heat sink 15 which conducts heat to the ambient environment of a room. The fan power used by this system would be about 20=W. In a data center, a typical, non-limiting ambient temperature $T_{air}$ may be about 25 C. An exemplary, non-limiting total thermal resistance R for a typical air cooled server is approximately 0.24 C/W, which for a 250 W CPU would result in a 60 C temperature gradient between the ambient environment and processor core. This results in a core temperature of $T_j$=85 C, where the core temperature of $T_j$=QR+$T_{ambient}$. In the foregoing, Q=250 W. An intrachip embedded cooling technology system according to an embodiment of the disclosure would not use the TIM1 12, the heat spreader 13, or the TIM2 14, and may lower the thermal resistance to ~0.04 C/W or less, thereby reducing the junction temperature, which can minimize processor power consumption with respect to similar computational throughput. The pumping power used by an intrachip embedded cooling technology system according to an embodiment of the disclosure would be about 0.5 W. As-a-rule of thumb, as compared with large channel or pool boiling approaches, a single or two-phase heat transfer involving small cavity channels is beneficial due to larger heat transfer surface per unit flow area near the heat source.

Two phase cooling typically requires condensation of the vapor phase of a coolant which is typically performed by energy intensive cooling systems. According to an embodiment of the disclosure, the pressure of a two phase coolant may be adjusted to have a boiling point based upon the outdoor ambient temperature, which enables the use of the ambient environment for condensing the vapor to liquid, thus eliminating the need for energy intensive cooling. A two phase cooling according to an embodiment of the disclosure may be used with circuit interconnects and packaging and other green technology services. The lower thermal resistance that is achievable through embedded cooling technology would enable year-round outdoor ambient cooling of a data center, thereby reducing the cooling energy required to transfer the chip heat to the outdoor ambient environment.

Figure 2A:
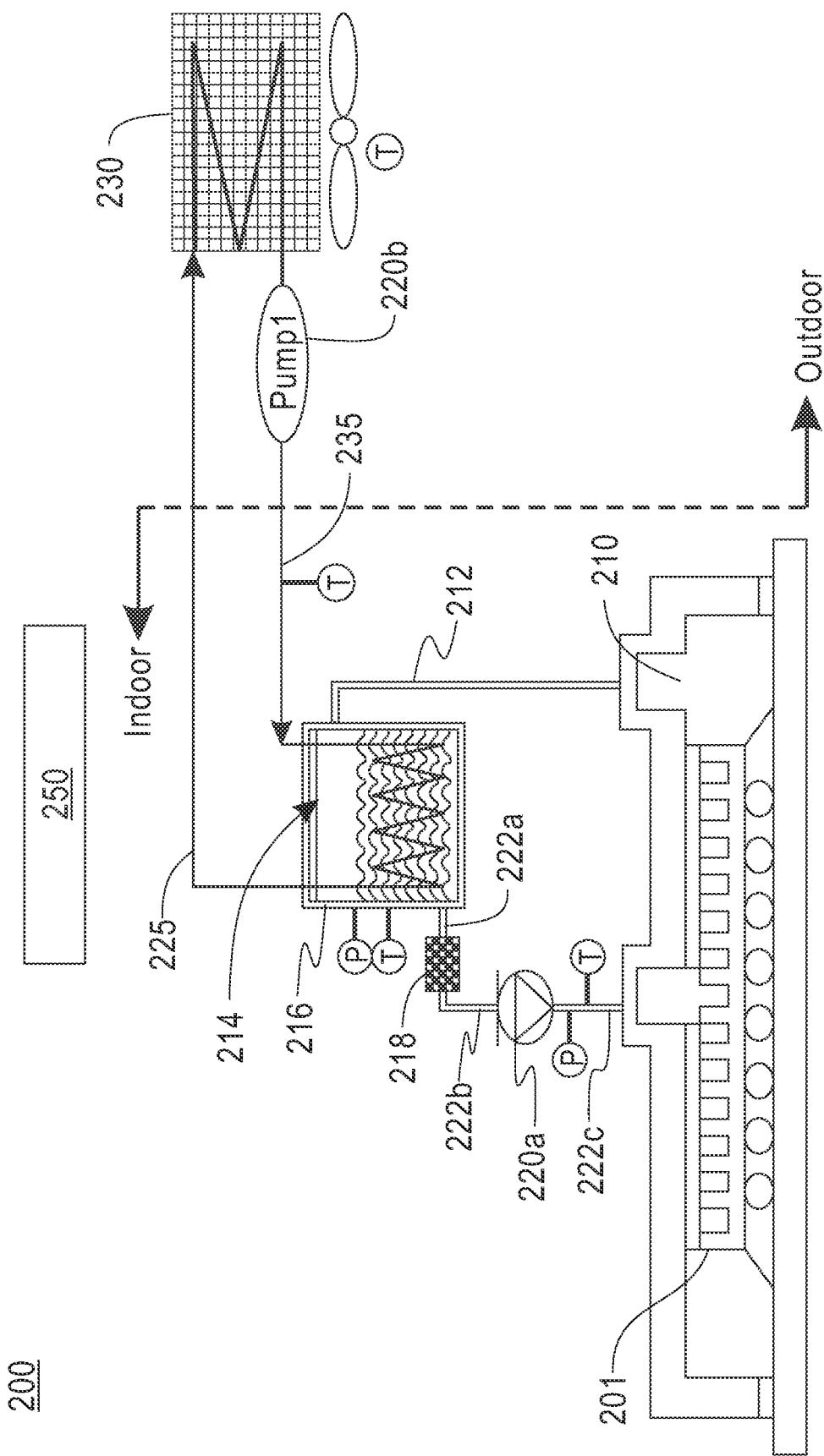
FIGS. 2(a)-(c) are system level schematic diagrams of a two-phase computer system cooling apparatus, according to embodiments of the disclosure.

FIG. 2(a) is a system level schematic of a thermal path from a chip to an ultimate heat sink, according to an embodiment of the disclosure. An exemplary, non-limiting cooling system 200 for a computer system includes a primary cooling loop and a secondary cooling loop. Referring to the figure, a primary cooling loop for an electronic device 201 includes an evaporator 210 for cooling at least a component of the computer system, which comprises embedded cooling in the electronic device 201, an ambient cooled condenser 216 with a reservoir connected to the evaporator 210 by piping 212, piping 222a, 222b, and 222c connecting the condenser/reservoir 216 back to the electronic device 201, a filter 218 connected between piping 222a and 222b for filtering particulates and a micro-pump 230a connected between piping 222b and 222c that can maintain a predetermined flow rate of a liquid coolant in the primary coolant loop. The ambient cooled condenser/reservoir 216 includes a movable diaphragm 214 that functions as a pressure regulator for maintaining the predetermined pressure of the liquid coolant in the primary liquid coolant loop. Note that the configuration of the micro-pump is exemplary and non-limiting, and the micro-pump 220a could also be disposed in piping 212 that carries the at least partially vaporized coolant from the evaporator 210 to the condenser 216.

A secondary cooling loop includes piping 225 that connects the condenser/reservoir 216 to a cooler 230, piping 235 that connects the cooler 230 back to the condenser/reservoir 216, and a first pump 220b that can maintain a predetermined flow rate of a liquid coolant in the secondary coolant loop. The primary cooling loop and secondary cooling loop also include temperature monitors T, such as thermocouples or thermometers, and pressure monitors P at various locations in the cooling loops to monitor both outside ambient temperature and temperature in the cooling loops, and pressure in the cooling loops. Note that the configuration of the first pump is exemplary and non-limiting, and the first pump 220b could also be disposed in piping 225 that carries the coolant from the condenser 216 to the cooler 230.

A cooling system 200 according to an embodiment of the disclosure also includes a controller 250 responsive to changes in outdoor ambient conditions, pressure in the cooling loops and the amount of heat dissipated by the computer system as measured by the temperature monitors for dynamically adjusting the one or both of the micro-pump and the first pump and pressure regulator in response to these changes to maintain the flow rate. An exemplary controller may be an embedded microcontroller that has been preprogrammed with optimal operating conditions of the cooling apparatus based on the outdoor ambient conditions and the amount of heat being dissipated by the computer system, and can determine an optimal temperature-delta above the ambient temperature, and the corresponding pressure for the liquid coolant. The outdoor ambient conditions include outdoor ambient temperature, and liquid pressure is regulated based on the outdoor ambient temperature. The outdoor ambient conditions may also include other weather related conditions such as humidity and air pressure, and the system may also include a humidity sensor to monitor other outdoor ambient environmental conditions.

The primary closed refrigerant loop transfers the heat from the electronic device package 201 to coolant in a secondary liquid loop which then transfers it to a cooler 230 to dissipate the heat to the outdoor ambient environment. The evaporator 210 cools high heat density components of the computer system 200 by evaporation of at least some of the liquid coolant into a vaporized coolant. The ambient cooled condenser/reservoir 214 condenses the vaporized coolant back into liquid form, and transfers heat released by condensation of the vaporized coolant to a coolant of the secondary coolant loop, which transfers the heat to the ambient environment by means of the cooler 230. Furthermore, low heat density components of the computer system may be used to preheat the liquid coolant.

Starting from the condenser/reservoir 216, which is partially filled with coolant in a liquid state (e.g. 60% by volume) while the remaining volume is filled with vapor phase of the coolant, the liquid coolant flows from the bottom of the reservoir 216 into the filter 218 where any possible particulates are filtered out. An exemplary, non-limiting filter would be about a 10 μm size filter. From the filter 218, the coolant flows in a liquid state to the micro-pump 220a which pumps the coolant into the electronic device package 201. The coolant enters the electronic device package 201 in liquid state and leaves the package as liquid-vapor mixture. The electronic device package 201 has micro-channels 210 at the back of the electronic device to facilitate cooling of the device. The coolant to captures heat from the electronic device as it flows through the micro-channels 210 that are embedded in the electronic device. This heat causes some amount of the liquid to boil and convert to vapor state. The coolant then exits the electronic device package 201 as liquid-vapor mixture. The liquid-vapor mixture then flows to the condenser 216 where all vapors are condensed to a liquid state. The pressure and temperature at which the vapor condenses is controlled by a movable diaphragm 214 and the coolant temperature of the secondary loop, respectively. The diaphragm 214 regulates the pressure inside the condenser 216. The diaphragm 214 can move-up to reduce the pressure or move down to increase the pressure inside the reservoir 216. The heat from the vapor is transferred to the secondary loop coolant at the condenser. From the secondary loop, heat is dissipated to the outdoor ambient environment through the use of the cooler 230.

According to various embodiments, the cooler 230 may be a dry cooler or a wet cooler. A dry-cooler is similar to a car radiator but bigger in size, and generally includes copper tubes with aluminum folded fins on the external surface of the tubes, and large fans to generate an air flow over the fins. When the liquid coolant is pumped through the copper tubes, heat is transferred from the copper tubes and folded-fins into the air stream flowing over the folded fins. A wet cooler is similar to a cooling-tower but smaller in size.

Figure 2B:
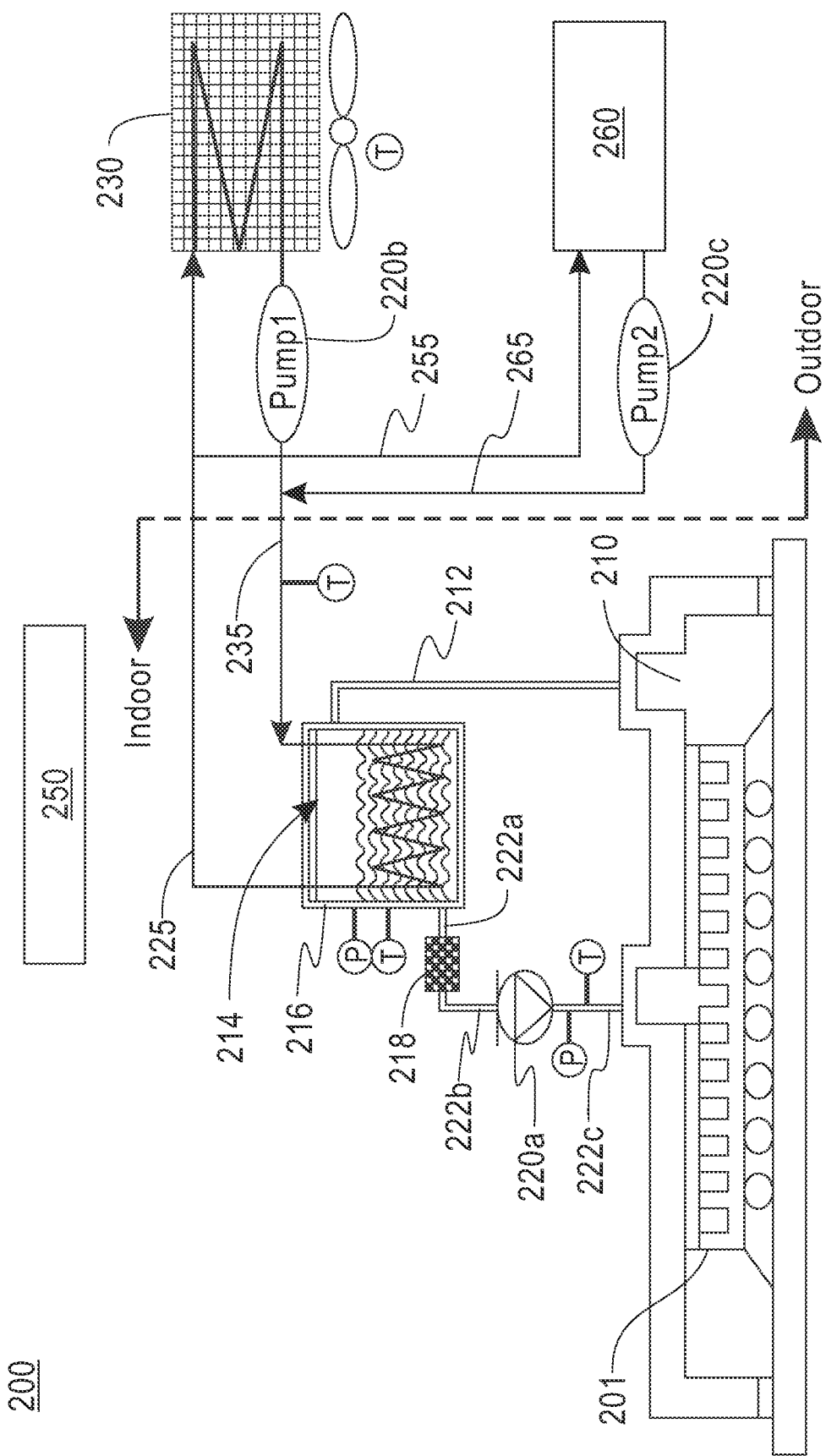

If the temperature of the coolant in the secondary loop is sufficiently high, heat could be recovered by an auxiliary system 260, as shown in FIG. 2(b), resulting in further improvements in system efficiency. Referring now to FIG. 2(b), the auxiliary system 260 may be part of a third coolant loop that is connected to piping 225 and 235 of the secondary loop by piping 255 and 265, respectively. A second pump 220c may be connected to piping 265 or piping 255 to generate fluid flow. The auxiliary system 260 may be, for example, a heat recovery system, a geothermal system, a building chiller, etc. As compared to a baseline air cooled system, this approach could enable up to 20× reduction in energy used for cooling.

Figure 2C:
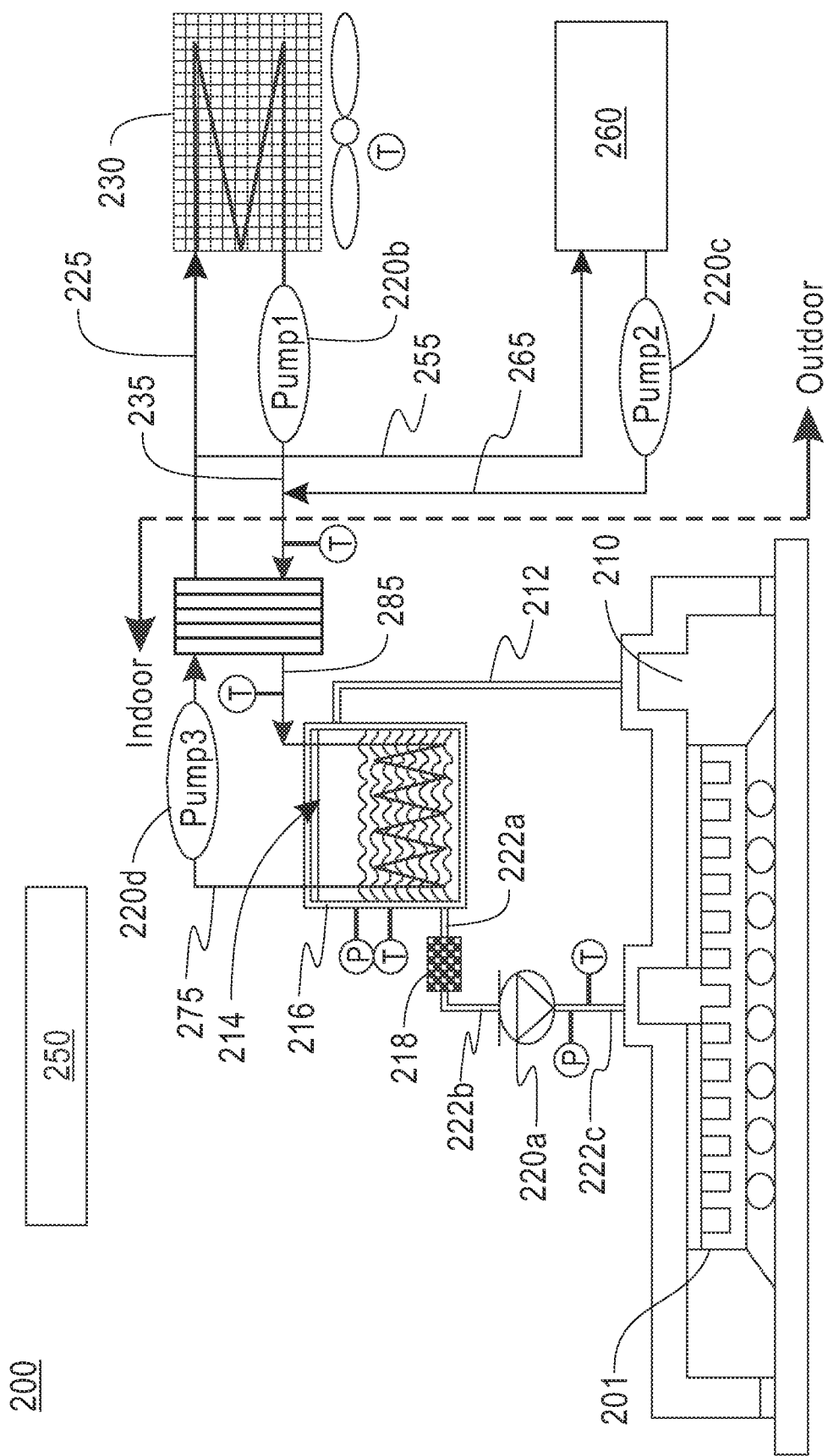

In places where sub-freezing temperature are expected for some part of the system operation, the secondary cooling loop may use an additional coolant with a lower freezing point, and include an additional heat exchange unit 270, as shown in FIG. 2(c). A liquid to liquid heat exchanger unit 270 transfers the heat from the one liquid coolant, such as water, to another liquid coolant, such as a 50% Ethylene Glycol (EG)+water solution. The EG solution can be used in the external portion of the secondary cooling loop. However, EG is not as good as water in terms of thermal performance, thus the liquid/liquid heat exchanger 270 can be used to create two loops, an indoor loop that uses water as the coolant and an external/outdoor loop that uses EG as the coolant. The indoor loop provides benefits of using water while the external loop provides the benefits of the anti-freeze solution. Referring now to FIG. 2(c), the liquid/liquid heat exchanger 270 is positioned between the condenser/reservoir 216 and the cooler 230. Coolant is pumped by a third pump 220d to flow from the condenser/reservoir 216 through piping 275 to the liquid/liquid heat exchanger 270, and returns to the condenser/reservoir 216 through piping 285. The EG solution flows from the liquid/liquid heat exchanger 270 to the cooler 230 through piping 225, and returns to the liquid/liquid heat exchanger 270 through piping 235, pumped by the first pump 220b. An exemplary, non-limiting liquid/liquid heat exchanger is a brazed-plate heat exchanger.

Such an ambient cooled system would have a tighter coupling between the outdoor ambient temperature and the refrigerant inlet temperature to the electronics. Thus, an energy efficient year round operation of such a system would use a refrigerant that suits the outdoor ambient conditions of the given location. During periods of warmer outdoor temperatures, the saturation pressure and temperature of the refrigerant can be regulated to reduce the cooling energy without adversely affecting the computational performance of the system. An exit coolant temperature of about 38° C. is sufficient for heat rejection in the hottest summer day and is also useful for a heat recovery system during the winter for heating buildings.

Figure 3:
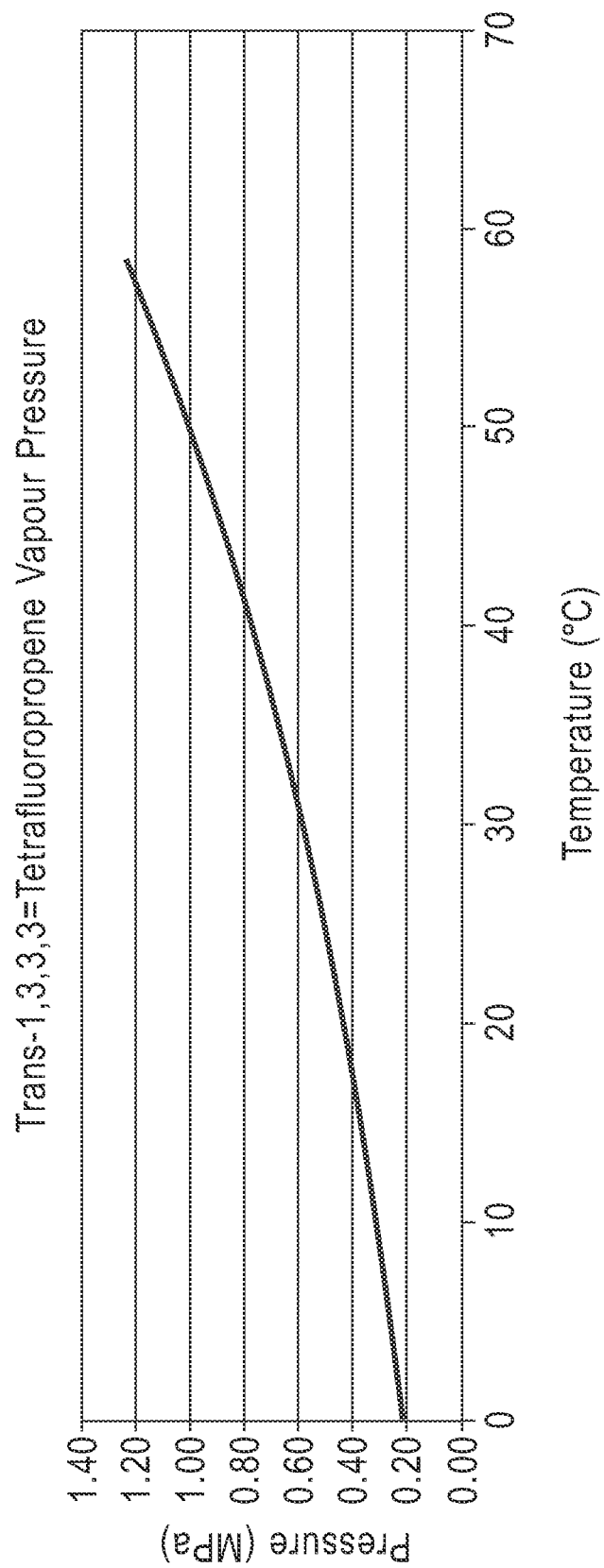
FIG. 3 is a graph of vapor pressure vs. temperature for an exemplary coolant according to an embodiment of the disclosure.

The boiling point vs. pressure for a typical refrigerant used for two phase cooling is shown in FIG. 3, which shows that pressure increases monotonically for increasing temperature. A exemplary, non-limiting refrigerant is trans-1,3,3,3-tetrafluoropropene. In particular the boiling point would be set to correspond to a temperature delta above the ambient temperature to enable energy optimized condensation using the outdoor ambient environment for condensing vapor to liquid, eliminating the need for energy intensive cooling. The boiling point can be determined from the temperature delta by reference to the boiling point vs. vapor pressure graph.

Figure 4:
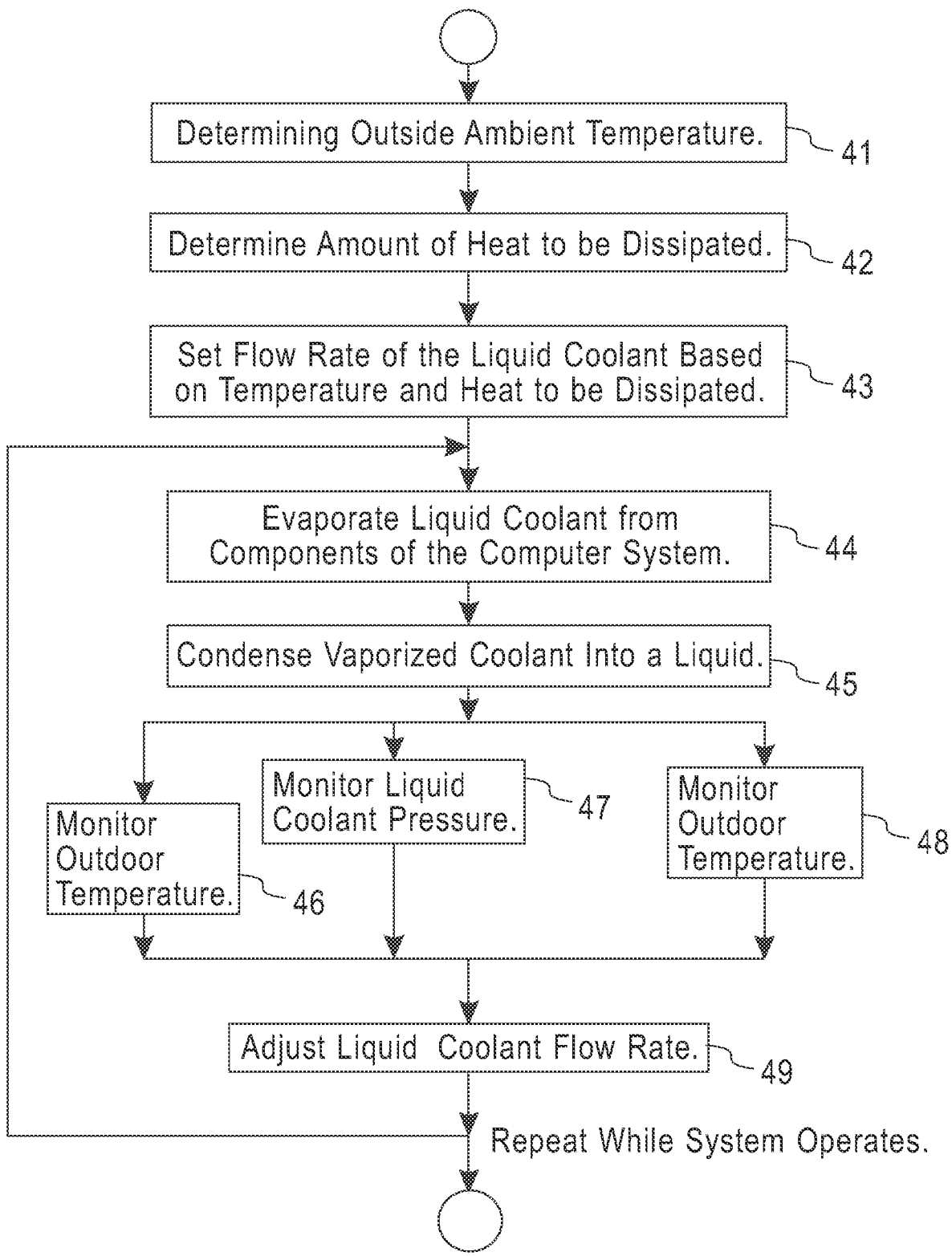
FIG. 4 is a flow chart of a method of cooling a computer system, according to an embodiment of the disclosure.

FIG. 4 is a flow chart of an exemplary, non-limiting method of cooling a computer system according to an embodiment of the disclosure. Referring now to the figure, a cooling method begins at step 41 by determining an outside ambient temperature, and continues at step 42 by determining an expected amount of heat to be dissipated from said computer system. The flow rate of the liquid coolant may be set at step 43 based on temperature delta above the outside ambient temperature and the expected amount of heat that minimizes an amount of energy needed to condense a vaporized coolant into a liquid coolant. The liquid coolant is evaporated from high heat density components of the computer system at step 44, which forms at least a partially vaporized coolant, and the vaporized coolant is condensed back into a liquid coolant at step 45. The liquid coolant may be evaporated in an evaporator, such as evaporator 210 shown in FIGS. 2(*a*)-(*c*), and may be condensed in a condenser, such as the condenser/reservoir 216 shown in FIGS. 2(*a*)-(*c*). Heat released by condensation of the vaporized coolant may be transferred to one of the ambient environment, a geothermal well, or an energy re-use apparatus such as a heat recovery system or a building chiller. The heat may be transferred by a secondary cooling loop.

An exemplary, non-limiting temperature delta between the liquid cooling the electronics and the outside environment may be from about 3° to over 20° C., depending upon the flow rates in different cooling loops. An exemplary, non-limiting maximum operating temperature for the electronics may be about 85° C., and a maximum outdoor temperature may be considered to be 45° C. At a 45° C. outdoor temperature, the flow rate may be adjusted so that the temperature delta is a minimum, about 3° C. In short, for higher outdoor temperatures, the temperature delta should be minimized. At a lower temperature, e.g. about 10° C. or lower, the flow rate should be lowered so that the liquid coolant temperature is within allowable limits and the pumping power/pressure drop in the system is low. In short, for lower outdoor temperatures, the pumping power/pressure drop should be minimized while the liquid temperature is maintained within the preset, allowable limits.

A cooling method according to an embodiment of the disclosure may further include monitoring the outdoor ambient temperature at step 46. The temperature may be monitored by a temperature monitor such as the thermocouples or thermometers T shown in FIGS. 2(*a*)-(*c*). In addition, a cooling method according to an embodiment of the disclosure may further include monitoring the liquid coolant pressure at step 47, and measuring an amount of heat dissipated by the computer system at step 48. The liquid coolant flow rate may be adjusted at step 49 in response to changes in one or more of the outdoor ambient temperature, the liquid coolant pressure, and the amount of heat dissipated by the computer system. Steps 44 to 49 may be continuously repeated while the computer system is operating. The liquid coolant may be optionally preheated using low heat density components of the computer system.

While embodiments of the present disclosure has been described in detail with reference to exemplary embodiments, those skilled in the art will appreciate that various modifications and substitutions can be made thereto without departing from the spirit and scope of the invention as set forth in the appended claims.

What is claimed is:

1. A method of cooling a computer system, comprising determining an outside ambient temperature;
determining an amount of heat to be dissipated from said computer system;
setting, by a controller, one of (1) a flow rate of a 2-phase liquid coolant in a primary coolant loop using a first pump, (2) a flow rate of a secondary single phase coolant loop using a second pump, or (3) a pressure of the primary coolant loop using a movable diaphragm, based upon a difference between a vaporized coolant temperature and an outdoor ambient temperature and the amount of heat to be removed from the computer system;
evaporating the liquid coolant from high heat density components of the computer system wherein the vaporized coolant is formed; and
condensing the vaporized coolant into a liquid coolant.

2. The method of claim 1, further comprising monitoring the outdoor ambient temperature and controlling the liquid coolant pressure in the primary coolant loop using the movable diaphragm in response to changes in the outdoor ambient temperature wherein a boiling point of the liquid coolant is maintained at a temperature greater than or equal to the outdoor ambient temperature.

3. The method of claim 1, further comprising monitoring the outdoor ambient temperature and changing one of the primary loop coolant flow rate and the secondary loop coolant flow rate in response to changes in the heat generated from the computer system.

4. The method of claim 1, further comprising measuring an amount of heat dissipated by the computer system, and changing the liquid coolant flow rate in response to changes in the amount of heat dissipated by the said computer system.

5. The method of claim 1, further comprising preheating the liquid coolant using low heat density components of the computer system.

6. The method of claim 1, further comprising transferring heat released by condensation of the vaporized coolant to one of an ambient, a geothermal, or an energy re-use apparatus.

7. The method of claim 1, further comprising adjusting the flow rate of the liquid coolant to minimize the temperature delta, such that a sum of the temperature delta and the outdoor ambient temperature is below a predetermined component junction temperature.

8. The method of claim 1, further comprising minimizing the flow rate of the liquid coolant while maintaining a temperature of the liquid coolant within preset limits, for outdoor temperatures less than 25° C.

9. The method of claim 1, wherein an amount of energy needed to condense a vaporized coolant into a liquid coolant is minimized.

10. The method of claim 1, wherein a target computer system operating temperature is maintained.

* * * * *